(12) United States Patent
Smith, Jr. et al.

(10) Patent No.: US 8,421,122 B2
(45) Date of Patent: Apr. 16, 2013

(54) HIGH POWER GALLIUM NITRIDE FIELD EFFECT TRANSISTOR SWITCHES

(75) Inventors: Thomas J. Smith, Jr., Raleigh, NC (US); Matthew Wills, Raleigh, NC (US); Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/110,573

(22) Filed: May 18, 2011

(65) Prior Publication Data

US 2012/0049973 A1 Mar. 1, 2012

Related U.S. Application Data

(60) Provisional application No. 61/346,753, filed on May 20, 2010.

(51) Int. Cl.
*H01L 29/66* (2006.01)
*H01L 31/0256* (2006.01)

(52) U.S. Cl.
USPC 257/194; 257/76; 257/E33.025; 257/E33.028; 257/E29.248

(58) Field of Classification Search .......... 257/194, 257/256, 341, 531, E29.248, 76, E33.025, 257/E33.028
See application file for complete search history.

(56) References Cited

U.S. PATENT DOCUMENTS

| | | | |
|---|---|---|---|
| 6,064,308 A | 5/2000 | Janning et al. | |
| 6,541,820 B1 | 4/2003 | Bol | |
| 6,560,452 B1 | 5/2003 | Shealy | |
| 7,173,548 B2 | 2/2007 | Yen | |
| 2004/0130374 A1 | 7/2004 | Barry et al. | |
| 2007/0126492 A1 * | 6/2007 | Pengelly | 327/430 |
| 2007/0228515 A1 | 10/2007 | Asahi | |
| 2008/0106353 A1 * | 5/2008 | Hangai et al. | 333/103 |
| 2009/0153242 A1 | 6/2009 | Cygan et al. | |

OTHER PUBLICATIONS

International Search Report Corresponding to International Application No. PCT/US2011/037125; Date of Mailing: Jul. 21, 2011; 10 pages.
International Preliminary Report on Patentability for corresponding application No. PCT/US2011/037125 mailed Nov. 29, 2012.

\* cited by examiner

*Primary Examiner* — Nikolay Yushin
(74) *Attorney, Agent, or Firm* — Myers Bigel Sibley & Sajovec

(57) ABSTRACT

A monolithic high power radio frequency switch includes a substrate, and first and second gallium nitride high electron mobility transistors on the substrate. Each of the first and second gallium nitride high electron mobility transistors includes a respective source, drain and gate terminal. The source terminal of the first gallium nitride high electron mobility transistor is coupled to the drain terminal of the second gallium nitride high electron mobility transistor, and the source terminal of the second gallium nitride high electron mobility transistor is coupled to ground. An RF input pad is coupled to the drain terminal of the first second gallium nitride high electron mobility transistor, an RF output pad is coupled to the source terminal of the first gallium nitride high electron mobility transistor and the drain terminal of the second gallium nitride high electron mobility transistor, and a control pad is coupled to the gate of the first gallium nitride high electron mobility transistor.

18 Claims, 8 Drawing Sheets

HIGH POWER GALLIUM NITRIDE FIELD EFFECT TRANSISTOR SWITCHES

CROSS REFERENCE TO RELATED APPLICATION

The present application claims the benefit of and priority to U.S. Provisional Patent Application No. 61/346,753, filed May 20, 2010, entitled "HIGH POWER GALLIUM NITRIDE FIELD EFFECT TRANSISTOR SWITCHES," the disclosure of which is hereby incorporated herein by reference in its entirety.

BACKGROUND

Microwave systems require the ability to actively redirect signal flow as desired for operational mode. For example, a broad band radio system often requires several antennas to cover the entire band of operation, while a single power amplifier can cover this operational bandwidth. Consequently, it is necessary to direct the high power amplifier signal to the required antenna structure, depending on the transmission frequency of the radio.

Handling high power RF and microwave signals requires switching devices that can operate reliably at high peak voltages. The most common approach to handle such high power levels using existing technology relies on PiN diode structures which demand high dc power for proper operation. In fact, PiN diode switches capable of handling 20 watts RF power commonly use up to 1 watt of dc power. This power consumption is a significant power burden, especially for applications requiring battery operation. In addition, due to the requirements of bias injection, PiN diode switches may be difficult to integrate, and may be limited to a reduced frequency bandwidth.

Alternatively, Gallium Arsenide (GaAs) HEMT switches, which have low dc power consumption, may not operate at high RF power levels. Switches using these devices may not be capable of handling high RF power levels due to the lower voltage handling of these devices.

SUMMARY

A monolithic high power radio frequency switch according to some embodiments includes a substrate, and first and second gallium nitride high electron mobility transistors on the substrate. Each of the first and second gallium nitride high electron mobility transistors includes a respective source, drain and gate terminal. The source terminal of the first gallium nitride high electron mobility transistor is coupled to the drain terminal of the second gallium nitride high electron mobility transistor, and the source terminal of the second gallium nitride high electron mobility transistor is coupled to ground.

The switch further includes an RF input pad coupled to the drain terminal of the first gallium nitride high electron mobility transistor, an RF output pad coupled to the source terminal of the first gallium nitride high electron mobility transistor and the drain terminal of the second gallium nitride high electron mobility transistor, and a control pad coupled to the gate of the first gallium nitride high electron mobility transistor.

The RF input pad may be coupled to the drain terminal of the first gallium nitride high electron mobility transistor through a first spiral inductor loop, and the RF output pad may be coupled to the source terminal of the first gallium nitride high electron mobility transistor and the drain terminal of the second gallium nitride high electron mobility transistor through a second spiral inductor loop.

The control pad may be coupled to the gate of the first gallium nitride high electron mobility transistor through a first resistor, and the complementary control pad may be coupled to the gate of the second gallium nitride high electron mobility transistor through a second resistor.

In some embodiments, the first resistor may have a resistance of at least about 1 kohm and the second resistor may have a resistance of at least about 1 kohm. In further embodiments, the first resistor may have a resistance of about 10 kohm and the second resistor may have a resistance of about 10 kohm.

Each of the first and second gallium nitride high electron mobility transistors may have a gate to drain spacing $L_{GD}$ that is equal to a gate to source spacing $L_{GS}$ of the gallium nitride high electron mobility transistor.

Each of the first and second gallium nitride high electron mobility transistors may have a serpentine gate pattern.

The monolithic high power radio frequency switch may demonstrate substantially linear transmission of over 20 watts of RF signal input power over a frequency range from 2.5 GHz to 4.0 GHz. A monolithic high power radio frequency switch according to some embodiments may demonstrate substantially linear transmission of over 20 watts of RF signal input power over a frequency range from 1.0 GHz to 4.0 GHz.

Further, the monolithic high power radio frequency switch demonstrates transmission loss of less than −0.4 dB for RF signals up to 4 GHz, and in some cases the monolithic high power radio frequency switch may demonstrate better than −8 dB input and output mismatch error at a frequency between 2.0 GHz and 4.0 GHz. A monolithic high power radio frequency switch according to some embodiments may demonstrate better than −20 dB input and output mismatch error at a frequency between DC and 4.0 GHz.

The switch may further include a second RF output pad on the substrate, and third and fourth gallium nitride high electron mobility transistors on the substrate, each of the third and fourth gallium nitride high electron mobility transistors including a respective source, drain and gate terminal. The drain terminal of the third gallium nitride high electron mobility transistor may be coupled to the drain terminal of the first gallium nitride high electron mobility transistor, the source terminal of the third gallium nitride high electron mobility transistor may be coupled to the drain terminal of the fourth gallium nitride high electron mobility transistor, the source terminal of the fourth gallium nitride high electron mobility transistor may be coupled to ground, the second RF output pad may be coupled to the source terminal of the third gallium nitride high electron mobility transistor and to the drain terminal of the fourth gallium nitride high electron mobility transistor, the control pad may be coupled to the gate of the fourth gallium nitride high electron mobility transistor, and the complementary control pad may be coupled to the gate of the third gallium nitride high electron mobility transistor.

The second RF output pad may be coupled to the source terminal of the third gallium nitride high electron mobility transistor and the drain terminal of the fourth gallium nitride high electron mobility transistor through a third spiral inductor loop.

The control pad may be coupled to the gate of the fourth gallium nitride high electron mobility transistor through a third resistor, and the complementary control pad may be coupled to the gate of the third gallium nitride high electron mobility transistor through a fourth resistor.

In some embodiments, the third resistor may have a resistance of at least about 1 kohm and the fourth resistor may have a resistance of at least about 1 kohm. In further embodiments, the third resistor may have a resistance of about 10 kohm and the fourth resistor may have a resistance of about 10 kohm.

Each of the first, second, third and fourth gallium nitride high electron mobility transistors may have a gate to drain spacing $L_{GD}$ that may be equal to a gate to source spacing $L_{GS}$ of the gallium nitride high electron mobility transistor.

Each of the first, second, third and fourth gallium nitride high electron mobility transistors may have a serpentine gate pattern.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DESCRIPTION OF EMBODIMENTS

Figure 1:
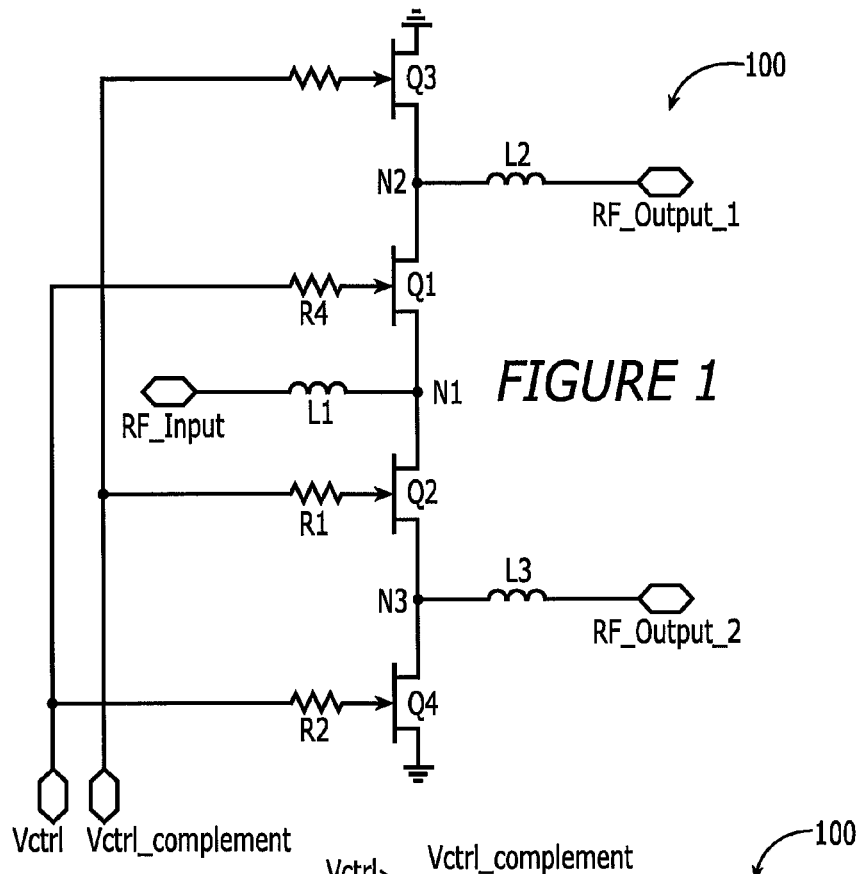
FIG. 1 shows the circuit topology of a device according to some embodiments.

Some embodiments provide a switching device that allows control over signal flow in an RF or microwave circuit. A switching device according to some embodiments may allow signal flow from a common input to be directed to an output (i.e., ON) with reduced or minimum signal loss, distortion, high power handling, low dc power dissipation, and good match. A switching device according to some embodiments may further switch a signal away from an output (i.e., OFF) with high signal loss over a wide frequency band.

In particular, some embodiments provide single pole, double throw (SPDT) switches that incorporate gallium nitride (GaN) high electron mobility transistors (HEMT) in a monolithic circuit on silicon carbide (SiC) substrates.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular foams "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Switching circuits/devices according to some embodiments may be capable of handling greater than 20 watts of RF power with very low loss (<0.7 dB, and in some cases <0.5 dB), high isolation (>30 dB), good match (>15 dB), and high third-order intercept point (>60 dBm) over a broad RF frequency band (100 MHz to 4 GHz, and in particular, 300 MHz to 3 GHz).

These results may be particularly surprising, because gallium nitride is known to have higher leakage current characteristics than other wide bandgap semiconductor materials, such as silicon carbide, and therefore would not normally be selected by a skilled person for use in a switching circuit. However, it has been found that a high power switch can be effectively made using a gallium nitride active region as described herein.

High power gallium nitride semiconductor devices, such as gallium nitride HEMTs, are well known. However, in general, higher leakage current results in lower bandwidth of the switch. Thus, for a high bandwidth, high power switch, gallium nitride is generally considered a poor choice, notwithstanding the low parasitic resistance of gallium nitride HEMTs.

In some embodiments, the power handling capability of the circuits/devices may be greater than 25 watts at only 0.1 dB compression. Circuits/devices according to some embodiments may consume less than 1 mW of dc power in operation. Furthermore, circuits/devices according to some embodiments may exhibit switching speeds less than 20 nsec, and in some cases may exhibit switching speeds of about 15 nsec.

Figure 2:
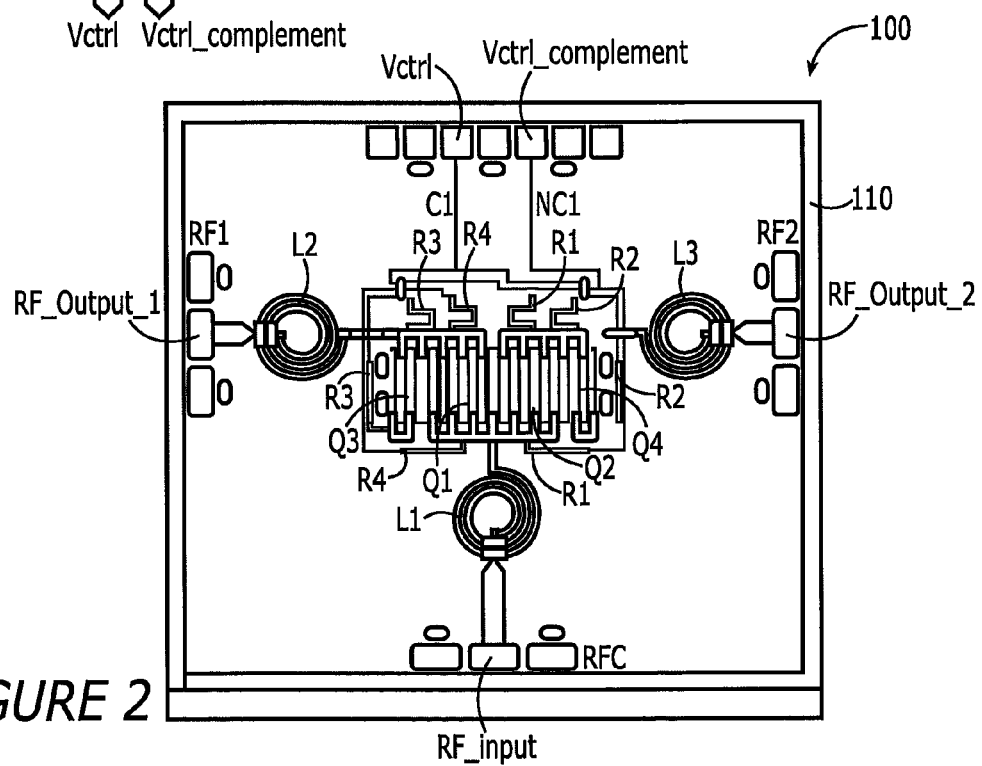
FIG. 2 shows a layout drawing of a monolithic die according to some embodiments.

FIG. 1 is a circuit diagram and FIG. 2 is a layout of a single pole, dual throw (SPDT) switching circuit 100 formed on a monolithic substrate 110 according to some embodiments. The circuit 100 may be implemented using gallium nitride based high electron mobility transistors (HEMTs) on a monolithic silicon carbide substrate 110.

Referring to FIGS. 1 and 2, the switching circuit 100 includes a control input pad Vctrl, a complementary control input pad Vctrl_complement, an RF input pad RF_Input, and first and second RF output pads RF_Output_1, RF_Output_2. The circuit 100 further includes four gallium nitride based high electron mobility transistors Q1 to Q4. Each of the four HEMTs Q1 to Q4 includes a source terminal S, a drain terminal D and a gate terminal G. The drain of the first HEMT Q1 is connected to a first node N1, while the source of the first HEMT Q1 is connected to a second node N2. The drain of the second HEMT Q2 is connected to the first node N1, while the source of the second HEMT Q2 is connected to a third node N3. The drain of the third HEMT Q3 is connected to the second node N2, and the source of the third HEMT Q3 is connected to ground. The drain of the fourth HEMT Q4 is connected to the third node N3, and the source of the fourth HEMT Q4 is connected to ground.

The control input pad Vctrl is connected through resistors R2 and R4 to gates of the first and fourth HEMTS Q1 and Q4. The complementary control input pad Vctrl_complement is connected through resistors R1 and R3 to gates of the second and third HEMTS Q2 and Q3. Although only single resistors are illustrated in FIG. 1, each of the transistors Q1 to Q4 may be dual-gate transistors that include two gates in the channel region of each device. Accordingly, there may be two parallel input resistors for each transistor, as indicated in FIG. 2. A given transistor in a FET switch can employ more than one gate to reduce the voltage across the critical points of the transistor, which may aid in power handling. However, the losses will be higher for each additional gate added. In particular, a dual gate FET switch, such as the switching circuit 100, may have about 0.2 dB additional loss.

The RF input pad RF_Input is connected through an inductance L1 to the first node N1. The first RF output pad RF_Output_1 is connected through an inductance L2 to the second node N2, while the second RF output pad RF_Output_2 is connected through an inductance L3 to the third node N3.

The inductors L1 to L3 may include spiral inductor networks that are designed to match the switch on the monolithic die to 50 ohms impedance.

The GaN HEMTs Q1 to Q4 may include multi-finger switch FETs including a number of 300 micron wide gates, symmetrically located in the FET channel so that the gate to drain distance is equal to the gate to source distance in each transistor.

The resistors R1 to R4 at the gates to the HEMTs Q1 to Q4 may have relatively large resistances, e.g., about 10 kohm.

GaN HEMT structures that may be used in embodiments of the present invention are disclosed in the following publications, the contents of each of which are incorporated herein by reference as if fully set forth herein: U.S. Pat. No. 6,849,882, entitled "Group-III nitride based high electron mobility transistor (HEMT) with barrier/spacer layer," issued Feb. 1, 2005; U.S. Pat. No. 7,230,284, entitled "Insulating gate AlGaN/GaN HEMT," issued Jun. 12, 2007; U.S. Publication No. 2007/0059873, entitled "Fabrication of single or multiple gate field plates," published Mar. 15, 2007; U.S. Pat. No. 7,550,783, entitled "Wide bandgap HEMTs with source connected field plates," issued Jun. 23, 2009; U.S. Publication No. 2006/0202272, entitled "Wide bandgap transistors with gate-source field plates," published Sep. 14, 2006; U.S. Pat. No. 7,501,669, entitled "Wide bandgap transistor devices with field plates," issued Mar. 10, 2009; U.S. Pat. No. 7,126,426, entitled "Cascode amplifier structures including wide bandgap field effect transistor with field plates," issued Oct. 24, 2006; and U.S. Pat. No. 7,573,078 "Wide bandgap transistors with multiple field plates," issued Aug. 11, 2009.

It will be appreciated that in some embodiments, a separate complementary control terminal Vctrl_complement may not be provided, and that the circuit could include an inverter that inverts the control signal Vctrl to form the complementary control signal that is applied to the gates of the second and third HEMTs Q2 and Q4. However, by providing a separate complementary control input pad Vctrl_complement, it is possible to place the switch 100 in a high impedance state in which RF signals do not flow to either of the output terminals by appropriate biasing of the control signals.

A signal entering the RF input terminal (RF_Input) is directed to either of the output terminals (RF_Output_1 or RF_Output_2), through the application of DC voltages on the control terminals (Vctrl, Vctrl_complement). The RF signal can equally pass in reverse from one of the output terminals to the input terminal.

The switch circuit 100 is operated by placing a negative DC voltage on one of the control lines, while grounding the other control line. For example, placing a negative voltage on control terminal Vctrl_complement while grounding Vctrl will place the second and third HEMTs Q2, Q3 into a nonconductive state and place the first and fourth HEMTs Q1, Q4 into a conductive state. This allows the RF signal to pass between the RF input terminal (RF_Input) and RF_Output_1. Reversing the voltages will shut off this path and allow the signal to flow between the RF input terminal and RF_Output_2.

Figure 3:
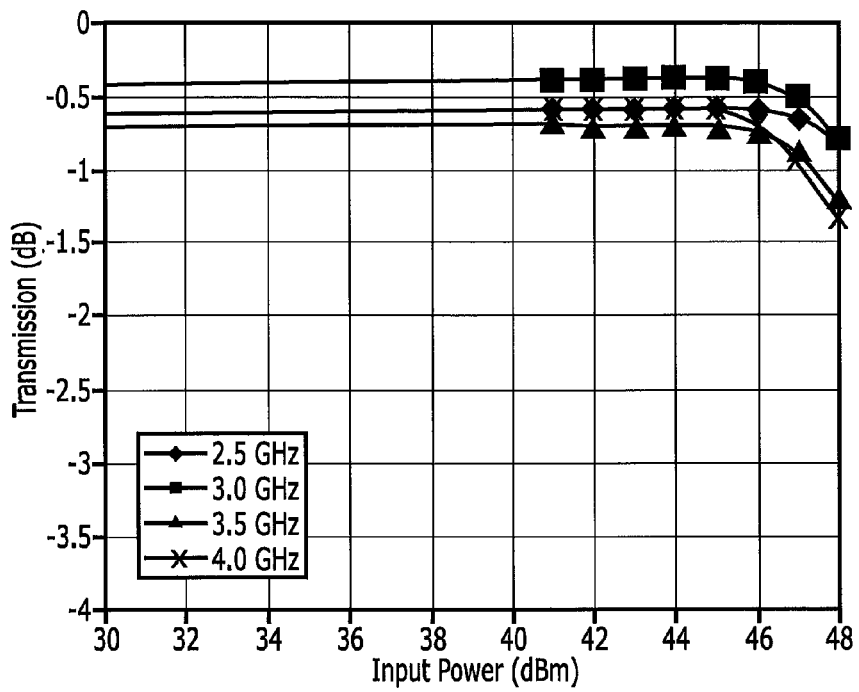
FIG. 3 shows the measured power handing of the SPDT switch circuit of FIG. 1.

The magnitude of the control voltage required to switch the HEMTs on and off (i.e., into conductive and non-conductive states, respectively) affects the power handling of the switch 100. In particular, FIG. 3 is a graph that illustrates measured switch loss for a switch as illustrated in FIGS. 1 and 2 versus input drive power at 2.5 GHz, 3.0 GHz, 3.5 GHz and 4.0 GHz. The results illustrated in FIG. 3 demonstrate linear transmission of over 20 watts (43 dBm) of RF signal over a wide frequency bandwidth.

The results shown in FIG. 3 were obtained with the control voltage set to −25 volts. If the voltage were increased to −30 volts, the power handling may be improved by approximately 1.5 dB. However, while operation at higher voltages is possible, there may be negative effects on switch operation due to operation closer to the FET breakdown voltage.

GaN HEMT switches are uniquely capable of handling high RF power levels with reduced or minimal DC power consumption, due to the unique properties of the GaN HEMT, namely, its high breakdown voltage and high thermal conductivity.

A GaN HEMT-based switch topology as described herein may be capable of simultaneous operation at high power levels and high RF frequency, while also allowing operation at frequencies as low as 20 MHz and consuming less than 1 mW of DC power. Such a topology may enable the realization of various switch circuits, such as SPDT, single pole three throw, single pole four throw, and combinations of these building blocks, to realize switch matrix networks and multiple input/output transfer switches.

In some embodiments, an SPDT switch 100 that is capable of high power operation has a modified FET structure in which the gate is located equidistant between the drain and source terminals. In contrast, in a typical HEMT structure, the gate is offset towards the source. Locating the gate equidistant between the drain and source terminals, coupled with the use of the large gate resistor, can provide that the total RF voltage will divide equally between the drain-gate space and the gate-source space. Since linear operation is limited when the voltage over either of these spaces exceeds the pinchoff or breakdown voltages of the transistor, equalizing the voltages may enable the switch to handle increased RF signal without violating either condition.

Because signal switching is a ubiquitous requirement in RF systems, applications of switch circuits according to embodiments of the invention may include any multifunction system. Specific types of systems include wideband communications radios, electronic warfare systems, including systems providing electronic counter-measures, as well as electronic counter-counter measures, radars, white noise jammers, test systems, etc.

Figure 4:
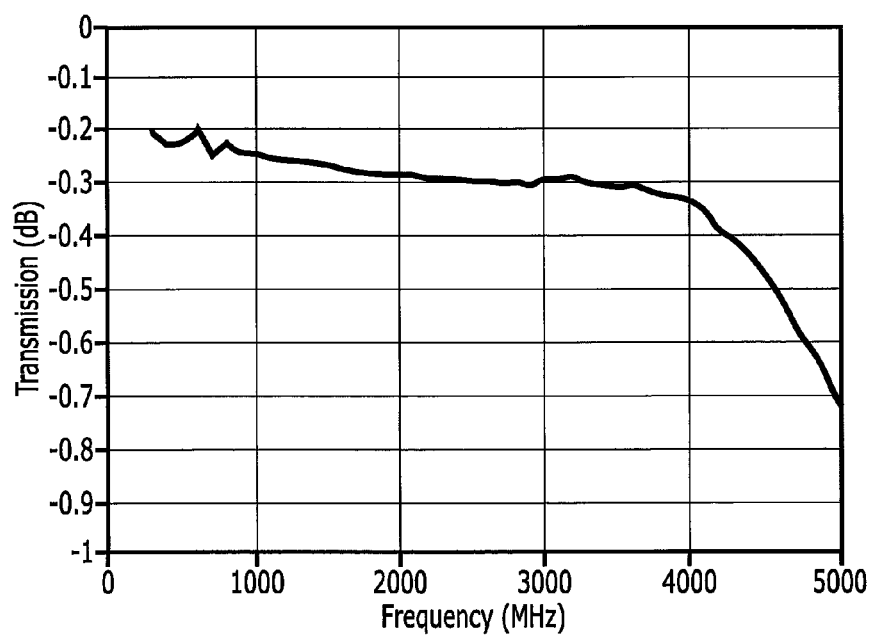
FIGS. 4 and 5 show wafer averaged small signal s-parameter measurements of transmission and mismatch on the input and the output of the selected path of the SPDT switch circuit of FIG. 1.

FIG. 4 is a graph that illustrates wafer average of measured SPDT switch transmission verses input signal frequency. The results illustrated in FIG. 4 demonstrate high transmission (low loss) of >−0.4 dB up to 4 GHz.

Figure 5A:
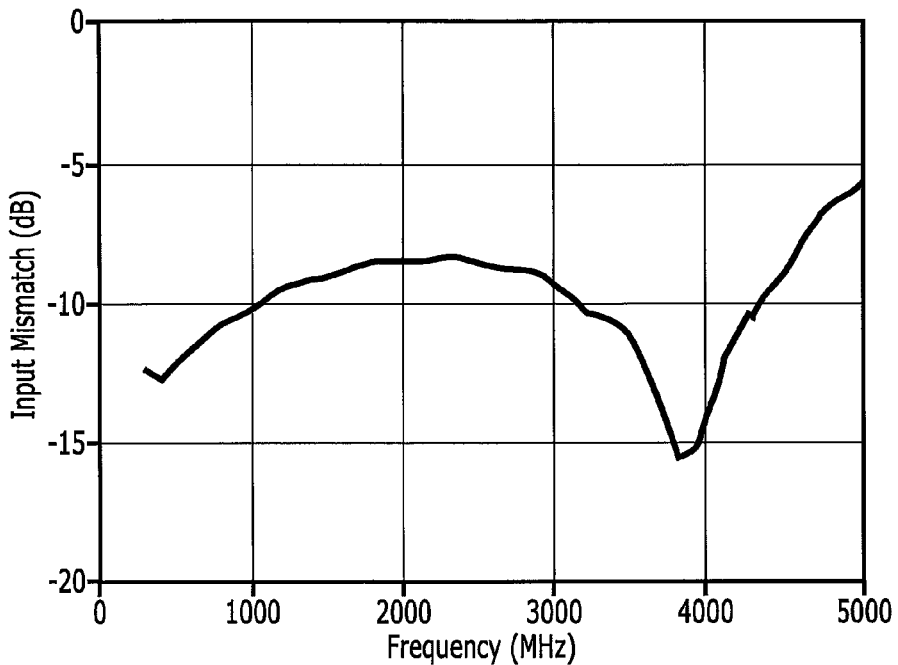
Figure 5B:
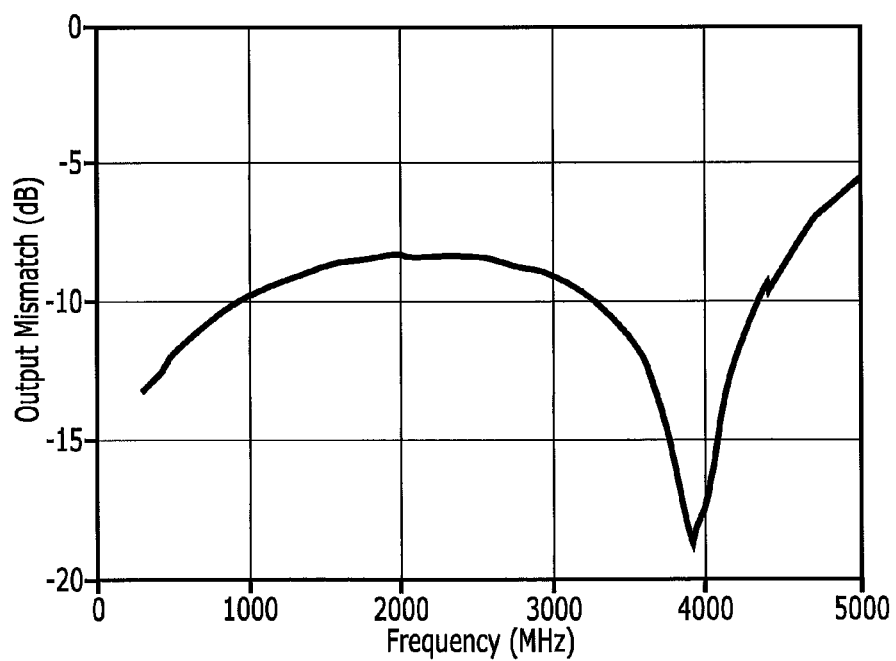

FIGS. 5A and 5B are graphs that illustrate wafer average of measured SPDT switch input (FIG. 5A) and output (FIG. 5B) mismatch. FIGS. 5A and 5B illustrate that the switch 100 may have better than −8 dB mismatch error.

Figure 6:
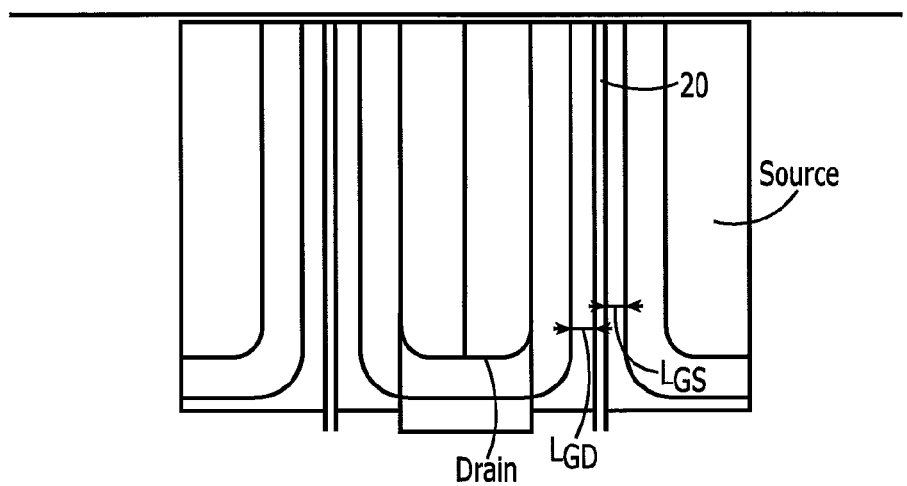
FIG. 6 shows a layout drawing of the details of the gate location in the channel of a FET according to some embodiments showing its location at the midpoint between the source and drain terminals of the transistor (i.e. $L_{GS}=L_{GD}$).

FIG. 6 is a schematic diagram that illustrates portions of a transistor layout in a switch 100 according to some embodiments. As shown in FIG. 6, source regions of a transistor are separated from the gate 20 by a distance $L_{GS}$, while drain regions of a transistor are separated from the gate by a distance $L_{GD}$. In some embodiments, the FET gates are positioned symmetrically between the source and drain regions, so that $L_{GD}$ is equal to $L_{GS}$.

Figure 7:
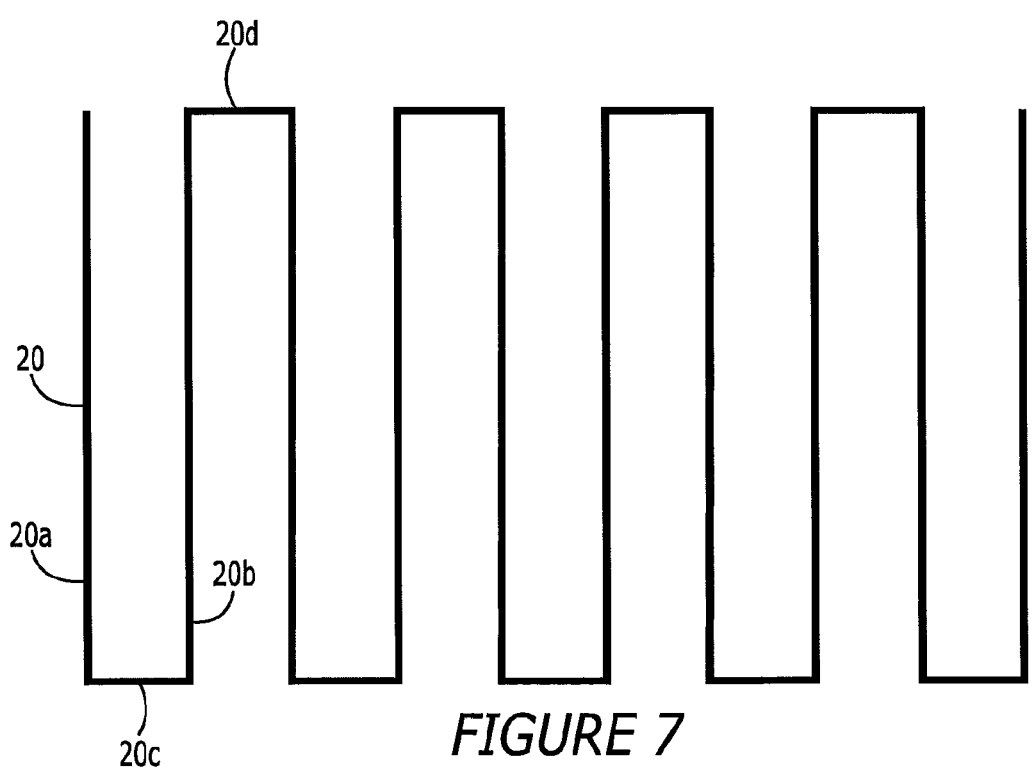
FIG. 7 illustrates a serpentine gate layout in accordance with some embodiments.

FIG. 7 illustrates a gate layout pattern in accordance with some embodiments. In particular, in some embodiments, the gate 20 may have a serpentine pattern as shown in FIG. 7. As shown in FIG. 7, a serpentine gate pattern may include gate segments 20a, 20b that are connected at alternating ends thereof by gate segment connectors 20c, 20d. A serpentine patterned gate may permit the transistor to have a more compact topology, which may reduce parasitic capacitance and/or resistance in the device. Reduced parasitic can increase the bandwidth of the device. Although it would be undesirable to use a serpentine gate pattern in a power device because of thermal constraints, a serpentine gate pattern can be used in a switching device according to some embodiments, because the device may not be thermally limited.

Figure 8:
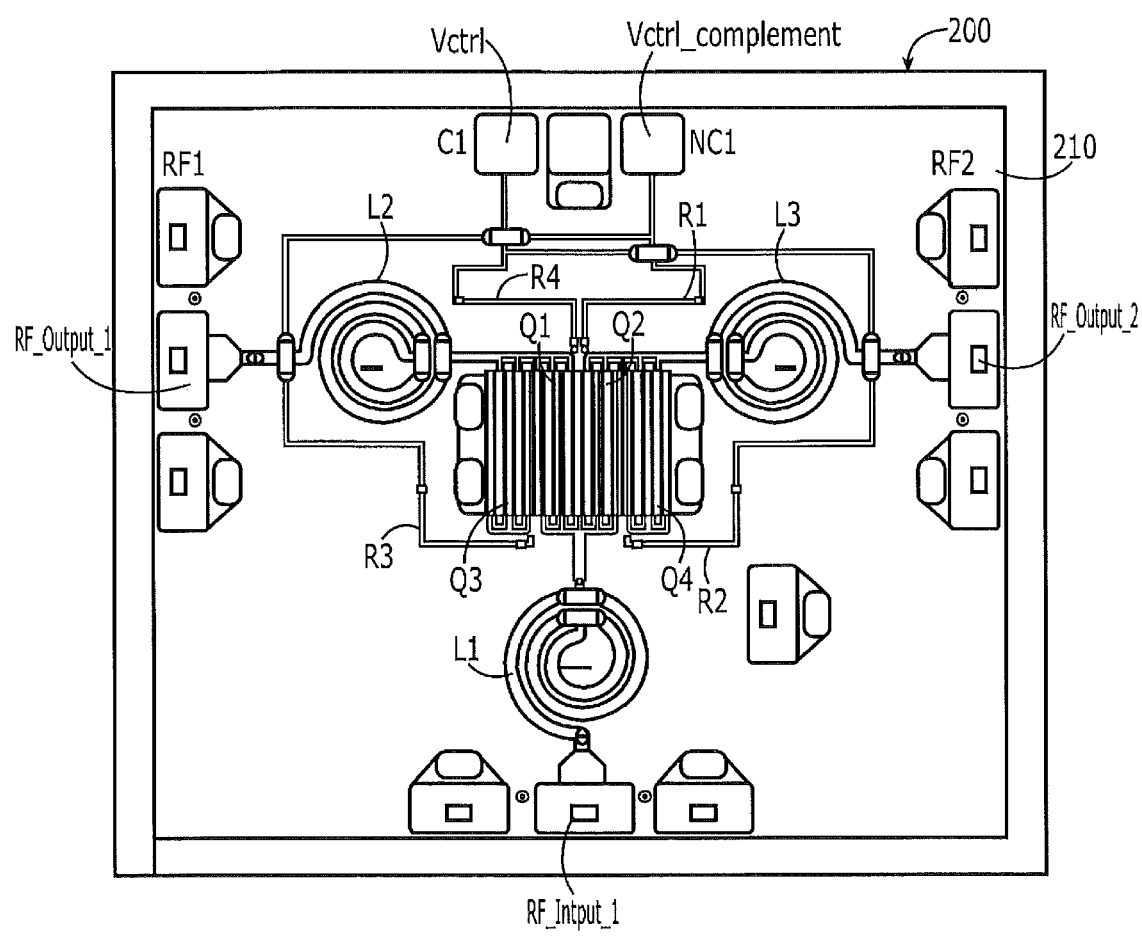
FIG. 8 shows a layout drawing of a monolithic die having a serpentine gate layout according to some embodiments.

FIG. 8 is a layout of a single pole, dual throw (SPDT) switching circuit 200 having a single-gate serpentine gate pattern formed on a monolithic substrate 210. The switching circuit 200 corresponds to the circuit diagram shown in FIG. 1.

Figure 9A:
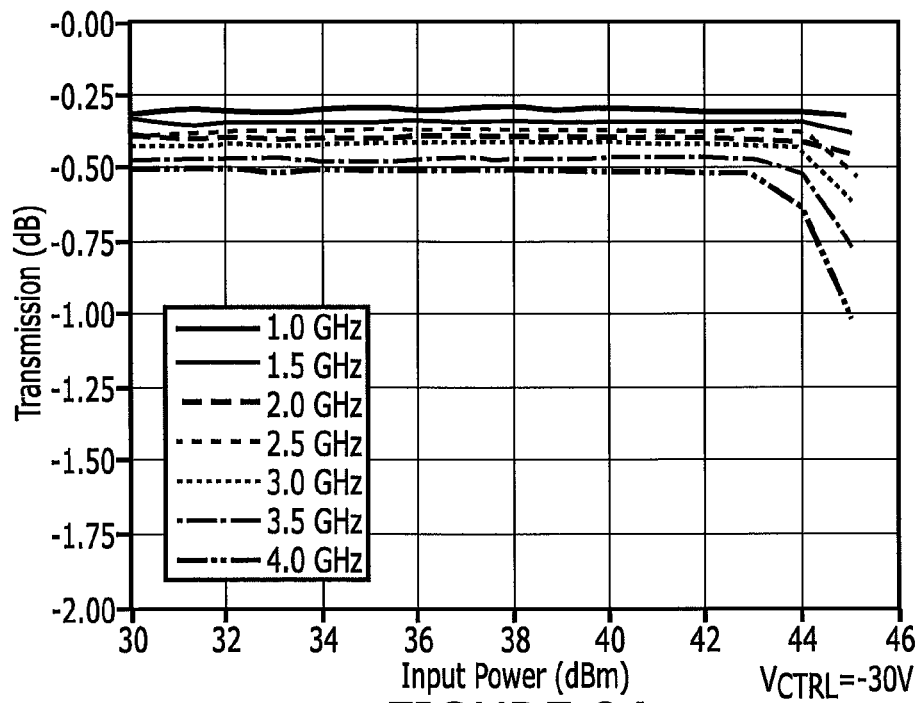
FIGS. 9A and 9B are graphs that illustrate transmission versus input drive power for a switch having a layout as shown in FIG. 8.
Figure 9B:
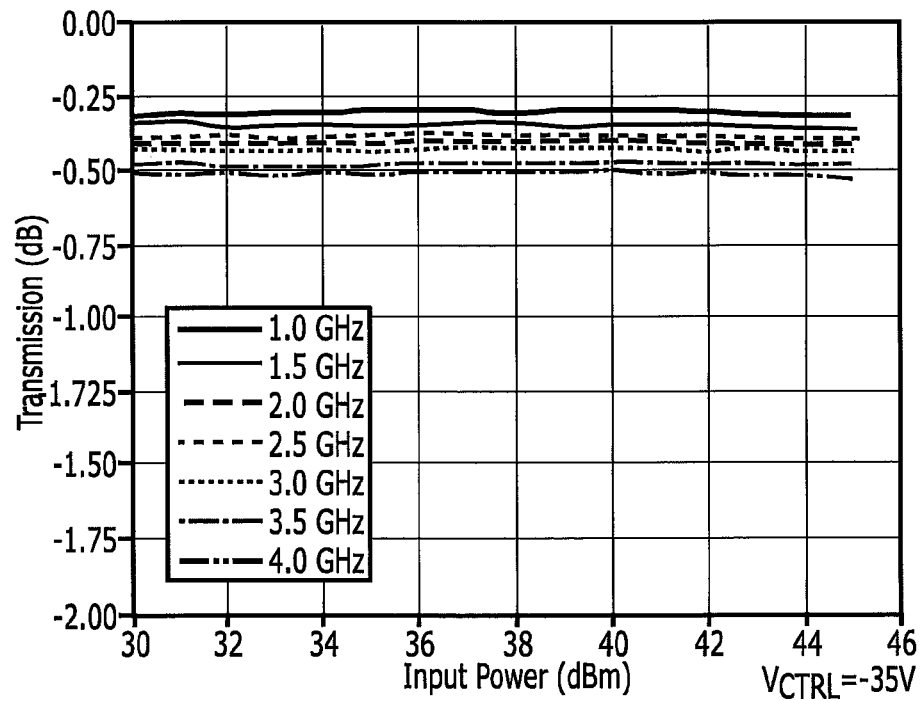

FIGS. 9A and 9B are graphs that illustrate transmission versus input drive power for a switch having a layout as shown in FIG. 8 for control voltages of −30V (FIG. 9A) and −35V (FIG. 9B) at 1.0 GHz, 1.5 GHz, 2.0 GHz, 2.5 GHz, 3.0 GHz, 3.5 GHz and 4.0 GHz. The results illustrated in FIG. 8 demonstrate linear transmission of over 20 watts (43 dBm) of RF signal over a wide frequency bandwidth.

Figure 10A:
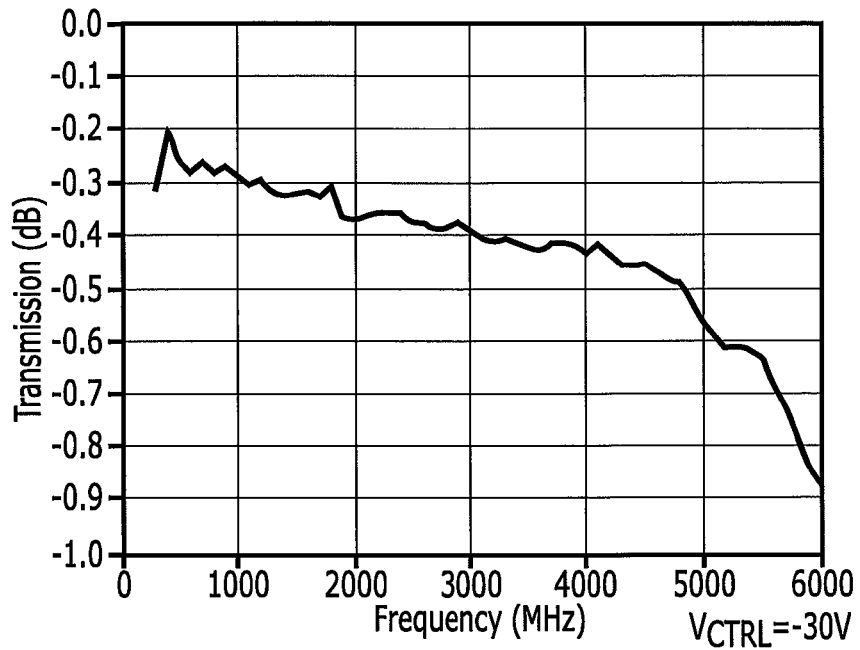
FIG. 10A is a graph that illustrates wafer average of measured SPDT switch transmission verses input signal frequency for a switch having a layout as shown in FIG. 8.

FIG. 10A is a graph that illustrates wafer average of measured SPDT switch transmission verses input signal frequency for a switch 200 having a layout as shown in FIG. 8. The results illustrated in FIG. 10A demonstrate high transmission (low loss) of >−0.5 dB up to 4 GHz.

Figure 10B:
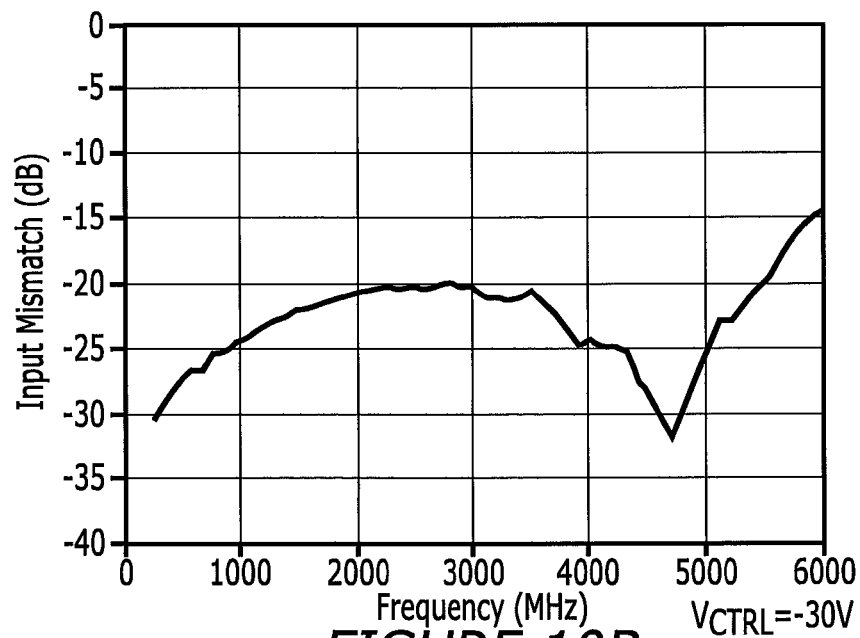
FIGS. 10B and 10C are graphs that illustrate wafer average of measured SPDT switch input and output mismatch for a switch having a layout as shown in FIG. 8.
Figure 10C:
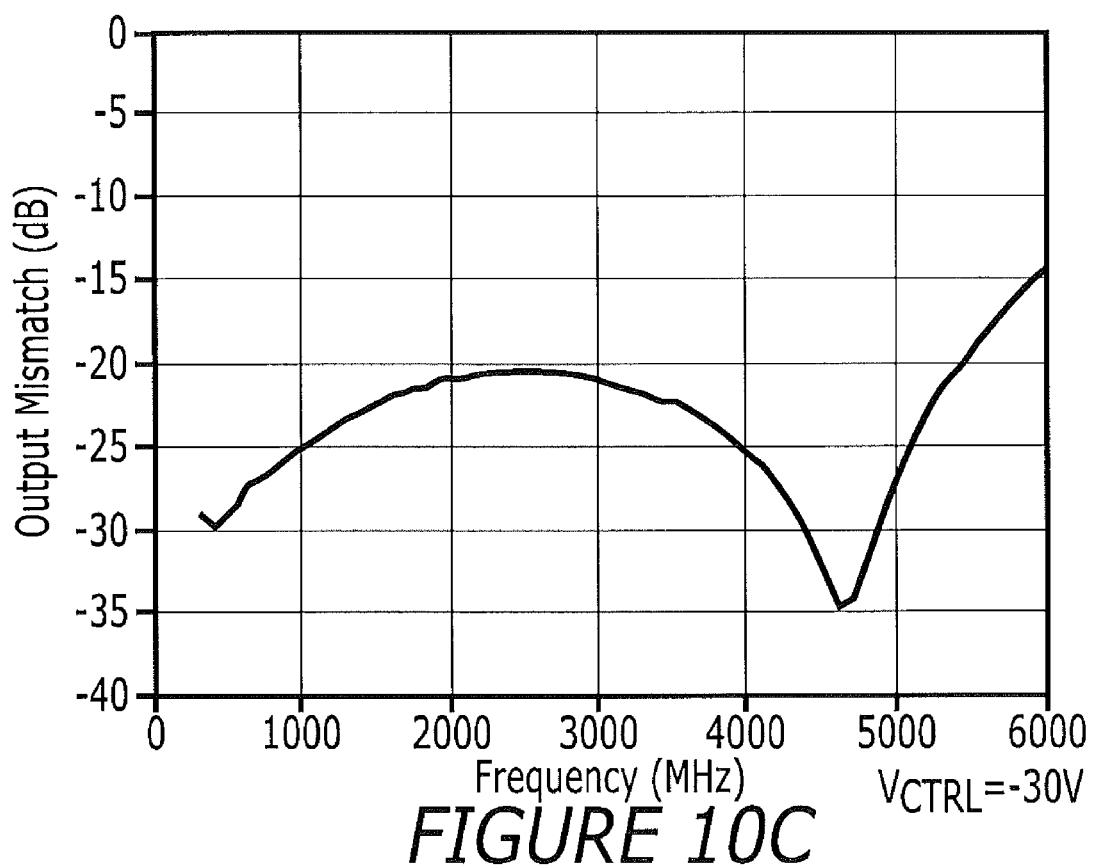

FIGS. 10B and 10C are graphs that illustrate wafer average of measured SPDT switch input (FIG. 10A) and output (FIG. 10B) mismatch for a switch 200 having a layout as shown in FIG. 8. FIGS. 10A and 10B illustrate that the switch 200 may have better than −20 dB mismatch error.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A monolithic high power radio frequency switch, comprising:
    a substrate;
    first and second gallium nitride high electron mobility transistors on the substrate, each of the first and second gallium nitride high electron mobility transistors including a respective source, drain and gate terminal, wherein the source terminal of the first gallium nitride high electron mobility transistor is coupled to the drain terminal of the second gallium nitride high electron mobility transistor, and the source terminal of the second gallium nitride high electron mobility transistor is coupled to ground;
    an RF input pad coupled to the drain terminal of the first gallium nitride high electron mobility transistor;
    an RF output pad coupled to the source terminal of the first gallium nitride high electron mobility transistor and the drain terminal of the second gallium nitride high electron mobility transistor; and
    a control pad coupled to the gate of the first gallium nitride high electron mobility transistor.

2. The monolithic high power radio frequency switch of claim 1, wherein the RF input pad is coupled to the drain terminal of the first gallium nitride high electron mobility transistor through a first spiral inductor loop, and wherein the RF output pad is coupled to the source terminal of the first gallium nitride high electron mobility transistor and the drain terminal of the second gallium nitride high electron mobility transistor through a second spiral inductor loop.

3. The monolithic high power radio frequency switch of claim 1, wherein each of the first and second gallium nitride high electron mobility transistors has a gate to drain spacing $L_{GD}$ that is equal to a gate to source spacing $L_{GS}$ of the respective first and second gallium nitride high electron mobility transistors.

4. The monolithic high power radio frequency switch of claim 1, wherein each of the first and second gallium nitride high electron mobility transistors has a serpentine gate pattern.

5. The monolithic high power radio frequency switch of claim 1, wherein the monolithic high power radio frequency switch demonstrates substantially linear transmission of over 20 watts of RF signal input power over a frequency range from 2.5 GHz to 4.0 GHz.

6. The monolithic high power radio frequency switch of claim 1, wherein the monolithic high power radio frequency switch demonstrates transmission loss of less than −0.4 dB for RF signals up to 4 GHz.

7. The monolithic high power radio frequency switch of claim 1, wherein the monolithic high power radio frequency switch demonstrates better than −8 dB input and output mismatch error at a frequency between 2.0 GHz and 4.0 GHz.

8. The monolithic high power radio frequency switch of claim 1, wherein the control pad is coupled to the gate of the first gallium nitride high electron mobility transistor through a first resistor, and wherein a complementary control pad is coupled to the gate of the second gallium nitride high electron mobility transistor through a second resistor.

9. The monolithic high power radio frequency switch of claim 8, wherein the first resistor has a resistance of at least about 1 kohm and wherein the second resistor has a resistance of at least about 1 kohm.

10. The monolithic high power radio frequency switch of claim 9, wherein the first resistor has a resistance of about 10 kohm and wherein the second resistor has a resistance of about 10 kohm.

11. The high power radio frequency switch of claim 1, wherein the RF output pad comprises a first RF output pad, the switch further comprising:
- a second RF output pad and a complementary control pad on the substrate; and
- third and fourth gallium nitride high electron mobility transistors on the substrate, each of the third and fourth gallium nitride high electron mobility transistors including a respective source, drain and gate terminal;

wherein:
- the drain terminal of the third gallium nitride high electron mobility transistor is coupled to the drain terminal of the first gallium nitride high electron mobility transistor;
- the source terminal of the third gallium nitride high electron mobility transistor is coupled to the drain terminal of the fourth gallium nitride high electron mobility transistor;
- the source terminal of the fourth gallium nitride high electron mobility transistor is coupled to ground;
- the second RF output pad is coupled to the source terminal of the third gallium nitride high electron mobility transistor and to the drain terminal of the fourth gallium nitride high electron mobility transistor;
- the control pad is coupled to the gate of the fourth gallium nitride high electron mobility transistor; and
- the complementary control pad is coupled to the gate of the third gallium nitride high electron mobility transistor.

12. The monolithic high power radio frequency switch of claim 11, wherein the second RF output pad is coupled to the source terminal of the third gallium nitride high electron mobility transistor and the drain terminal of the fourth gallium nitride high electron mobility transistor through a third spiral inductor loop.

13. The monolithic high power radio frequency switch of claim 11, wherein the third resistor has a resistance of about 10 kohm and wherein the fourth resistor has a resistance of about 10 kohm.

14. The monolithic high power radio frequency switch of claim 11, wherein each of the first, second, third and fourth gallium nitride high electron mobility transistors has a gate to drain spacing $L_{GD}$ that is equal to a gate to source spacing $L_{GS}$ of the gallium nitride high electron mobility transistor.

15. The monolithic high power radio frequency switch of claim 11, wherein each of the first, second, third and fourth gallium nitride high electron mobility transistors has a serpentine gate pattern.

16. The monolithic high power radio frequency switch of claim 11, wherein the control pad is coupled to the gate of the fourth gallium nitride high electron mobility transistor through a third resistor, and wherein the complementary control pad is coupled to the gate of the third gallium nitride high electron mobility transistor through a fourth resistor.

17. The monolithic high power radio frequency switch of claim 16, wherein the third resistor has a resistance of at least about 1 kohm and wherein the fourth resistor has a resistance of at least about 1 kohm.

18. A high power radio frequency switch, comprising:
- first and second gallium nitride high electron mobility transistors, each of the first and second gallium nitride high electron mobility transistors including a respective source, drain and gate terminal, wherein the source terminal of the first gallium nitride high electron mobility transistor is coupled to the drain terminal of the second gallium nitride high electron mobility transistor, and the source terminal of the second gallium nitride high electron mobility transistor is coupled to ground;
- an RF input pad coupled to the drain terminal of the first second gallium nitride high electron mobility transistor;
- an RF output pad coupled to the source terminal of the first gallium nitride high electron mobility transistor and the drain terminal of the second gallium nitride high electron mobility transistor;
- a control pad coupled to the gate of the first gallium nitride high electron mobility transistor; and
- a complementary control pad coupled to the gate of the second gallium nitride high electron mobility transistor.

* * * * *